(12) United States Patent
Hirasawa

(10) Patent No.: US 9,131,615 B2
(45) Date of Patent: Sep. 8, 2015

(54) PRINTED CIRCUIT BOARD

(71) Applicant: CANON KABUSHIKI KAISHA, Tokyo (JP)

(72) Inventor: Hideaki Hirasawa, Fuji (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/059,777

(22) Filed: Oct. 22, 2013

(65) Prior Publication Data

US 2014/0041920 A1    Feb. 13, 2014

Related U.S. Application Data

(63) Continuation of application No. 12/544,156, filed on Aug. 19, 2009, now Pat. No. 8,681,509.

(30) Foreign Application Priority Data

Aug. 21, 2008  (JP) .................................. 2008-212814
Jul. 27, 2009  (JP) .................................. 2009-174236

(51) Int. Cl.
*H05K 1/11* (2006.01)
*H05K 1/02* (2006.01)
*H05K 3/34* (2006.01)

(52) U.S. Cl.
CPC ................ *H05K 1/11* (2013.01); *H05K 1/111* (2013.01); *H05K 3/3468* (2013.01); *H05K 1/0203* (2013.01); *H05K 3/3421* (2013.01); *H05K 3/3452* (2013.01); *H05K 2201/0989* (2013.01); *H05K 2201/09772* (2013.01); *H05K 2201/09781* (2013.01); *H05K 2201/10522* (2013.01); *H05K 2201/10659* (2013.01); *H05K 2201/10689* (2013.01); *H05K 2203/046* (2013.01)

(58) Field of Classification Search
USPC .................................... 174/261, 260; 361/767
See application file for complete search history.

(56) References Cited

U.S. PATENT DOCUMENTS

| 6,392,163 | B1 * | 5/2002 | Rinne et al. | .................... 174/261 |
| 2006/0060867 | A1 * | 3/2006 | Suehiro | ........................... 257/81 |
| 2008/0057743 | A1 * | 3/2008 | Sogabe | ........................... 439/65 |

* cited by examiner

*Primary Examiner* — Andargie M Aychillhum
(74) *Attorney, Agent, or Firm* — Canon USA, Inc. IP Division

(57) ABSTRACT

A printed circuit board has a first solder land, a second solder land, and a signal line pattern. The first solder land is configured to be soldered with an electronic part. The second solder land is configured to accumulate solder, the second solder land being disposed on a downstream side of the first solder land as viewed in a direction in which the printed circuit is carried. The signal line pattern includes an exposed part that is not covered with a resist, the exposed part being disposed between the solder land and the solder bridge prevention land.

8 Claims, 15 Drawing Sheets

PRINTED CIRCUIT BOARD

CROSS-REFERENCE TO RELATED APPLICATION

This application is a Continuation of U.S. application Ser. No. 12/544,156, filed Aug. 19, 2009, which claims priority from Japanese Patent Application No. 2008-212814 filed Aug. 21, 2008 and No. 2009-174236 filed Jul. 27, 2009, which are hereby incorporated by reference herein in their entireties.

BACKGROUND OF THE INVENTION

1. Field of the Invention

The present invention relates to a printed circuit board on which a flat package IC (Integrated Circuit) is mounted using a flow soldering technique.

2. Description of the Related Art

In recent years, there has been a trend to mount a greater number of components on a printed circuit board. Thus, mounting ICs (Integrated Circuits) with a flat package such as a SOP (Small Outline Package) or a QFP (Quad Flat Package) at small intervals is to be performed. On the other hand, to achieve a reduction in cost, mounting IC packages by flow soldering is to be performed. In the flow soldering, to achieve high performance in soldering without having solder bridges, the soldering process is to be controlled precisely.

A known technique to prevent formation of solder bridges is to form a dummy land on a downstream side of an IC as viewed in a solder flow direction. Hereinafter, the downstream side as viewed in the solder flow direction will be referred to simply as the downstream side. Another known technique is to increase the size of a most-downstream-located land of an IC such that this land serves as a solder sink land. FIG. 14 illustrates an example of a solder bridge prevention land for a SOP package. In FIG. 14, reference numerals 104 and 102 denote lands (copper-exposed parts of patterns) of an IC 103 with a package of the SOP type. Note that a no-resist part of a pattern where copper is exposed will be simply referred to as a copper-exposed part. The lands 102 are located at the most downstream positions of the IC 103 as viewed in the solder flow direction. In FIG. 14, the direction of the movement of the printed circuit board during the soldering process is represented by an arrow. That is, the solder flows in a direction opposite to the arrow and thus upstream and downstream sides of the solder flow are as shown in FIG. 14. In FIG. 14, thin solid lines represent pins of the IC 103. Note that these thin solid lines partially overlap thick lines representing the lands 102 and 104.

A solder bridge prevention land (also referred to as a dummy land) 101 is formed on the downstream side of the land 102 as viewed in the solder flow direction. In the flow soldering process, solder is drawn into the solder bridge prevention lands 101. This leads to a reduction in surface tension and interfacial tension of solder adhering to the lands 104 and 102 and the pins of the IC 103 located on the upstream side, and thus formation of solder bridges at the lands 104 and 102 and the pins of the IC 103 is prevented.

FIG. 15 illustrates another example of a solder bridge prevention land for a SOP package. The example shown in FIG. 15 is different from that shown in FIG. 14 in that a solder bridge prevention land 111 is formed by expanding a land to be connected to a pin 112, at the most downstream location, of an IC 103.

There are further known techniques to prevent formation of solder bridges as described below.

For example, Japanese Patent Laid-Open No. 63-213994 discloses a board pattern including lands on which to mount an IC with a package of the QFP type in a slant direction with respect to a solder flow direction and also including a dummy land formed on a downstream side in a solder flow direction thereby preventing formation of a solder bridge. Japanese Patent Laid-Open No. 2-119295 discloses a board pattern including lands for soldering a chip component and also including a dummy land formed on a downstream side in a solder flow direction thereby preventing formation of a solder bridge. Japanese Patent Laid-Open No. 4-208594 discloses a board pattern including lands for soldering an IC with a SOP-type package and also including a dummy land formed on a downstream side in a solder flow direction thereby preventing formation of a solder bridge. Japanese Patent Laid-Open No. 5-315733 discloses a board pattern for mounting an IC with a QFP-type package, including a solder sink land having a slit for well draining solder thereby preventing formation of a solder bridge. However, the conventional board patterns described above may have issues. More specifically, for example, use of a land for preventing formation of a solder bridge, such as a dummy land or a solder sink land, leads to a reduction in flexibility in designing a pattern of a printed circuit board. An example of low flexibility in designing patterns is a restriction on the size of a heat radiation pattern, which results in a reduction in heat radiation performance of a mounted IC. To avoid such a reduction in heat radiation performance, the size of a printed circuit board is to be increased so that a heat radiation pattern with a large enough size can be formed thereon, or a heat radiation plate in addition to the heat radiation pattern is to be provided. In a case where a printed circuit board needs a GND (ground) pattern having a large enough size and having a large enough number of connections to reduce an effect of a spurious radiation noise from a CPU (Central Processing Unit) or the like, the low flexibility in designing patterns leads to a restriction on the size of the ground pattern or the number of connections.

For example, in the case of a printed circuit board on which an IC having a heat radiation pin, such as a motor driver IC, is mounted, the existence of a land for preventing formation of a solder bridge such as a dummy land or a solder sink land can be an obstacle that makes it difficult to form a large-size heat-radiation copper film pattern connected to the heat radiation pin. That is, if the land for preventing formation of solder bridges is formed to be large enough, the result is a reduction in a space usable to form a heat radiation pattern. In the case of a printed circuit board having a signal line extending between a heat radiation pin and a heat radiation copper pattern, the existence of the signal line makes it difficult to directly connect the heat radiation pin to the heat radiation copper pattern. One method to realize the connection between them is to use a jumper wire to connect the heat radiation pin and the heat radiation copper pattern. However, formation of lands for the jumper wire results in a reduction in the size of the heat radiation copper pattern.

In recent years, there has been a trend toward a reduction in the pin-to-pin distance of an IC that is mounted via a flow soldering technique on a printed circuit board (and thus a reduction in the land-to-land distance of lands formed on the printed circuit board). To effectively prevent formation of solder bridges on such a printed circuit board, the size of a land for preventing formation of solder bridges is to be increased.

SUMMARY OF THE INVENTION

According to an aspect of the present invention, there is provided a printed circuit board comprising a first solder land configured to be soldered with an electronic part, a second solder land configured to accumulate solder, the second solder land being disposed on a downstream side of the first solder land as viewed in a direction in which the printed circuit board is carried, and a signal line pattern including an exposed part that is not covered with a resist, the exposed part being disposed between the first solder land and the second solder land.

According to an aspect of the present invention, there is provided a printed circuit board comprising a first solder land configured to be soldered with a first electronic part, a second solder land disposed such that the second solder land and the first solder land are located in a single line, and a signal line pattern including an exposed part that is not covered with a resist, the exposed part being disposed between the first solder land and the second solder land.

Further features of the present invention will become apparent from the following description of exemplary embodiments with reference to the attached drawings.

DESCRIPTION OF THE EMBODIMENTS

Embodiments of printed circuit boards according to the present invention are described in detail below with reference to the accompanying drawings. Note that the embodiments disclosed below are merely examples, and the invention is not limited to these embodiments.

Now, the present invention is described in further detail below with reference to embodiments.

In a first embodiment, disclosed is a board pattern layout that allows a heat radiation pin of a stepping motor driver IC (hereafter, referred to simply as a heat radiation pin) to be connected to a land for preventing formation of solder bridges (hereinafter, referred to simply as a solder as a solder bridge prevention land).

In the present embodiment, a printed circuit board is configured in the form of a single-sided (single-layer) board. In the present embodiment, to mount components on the printed circuit board, a flow soldering technique is used. In the flow soldering technique, electronic parts are soldered to the printed circuit board by transporting the printed circuit board in a solder bath in which solder flows in the form of a jet stream. Examples of materials of the printed circuit board are CEM-3 (Composite Epoxity Material-3), FR-4 (Flame Retardant-4), and FR-1 (paper base phenolic resin). FR-1 is often used in particular in a case where a cost reduction is important. Single-sided printed circuit boards have a great restriction on wiring pattern layout, and thus the present invention is very useful when the invention is applied to single-sided printed circuit board. Note that the present invention is also useful when the invention is applied to a printed circuit board having two or more layers on which parts are mounted using a flow soldering technique.

Figure 1:
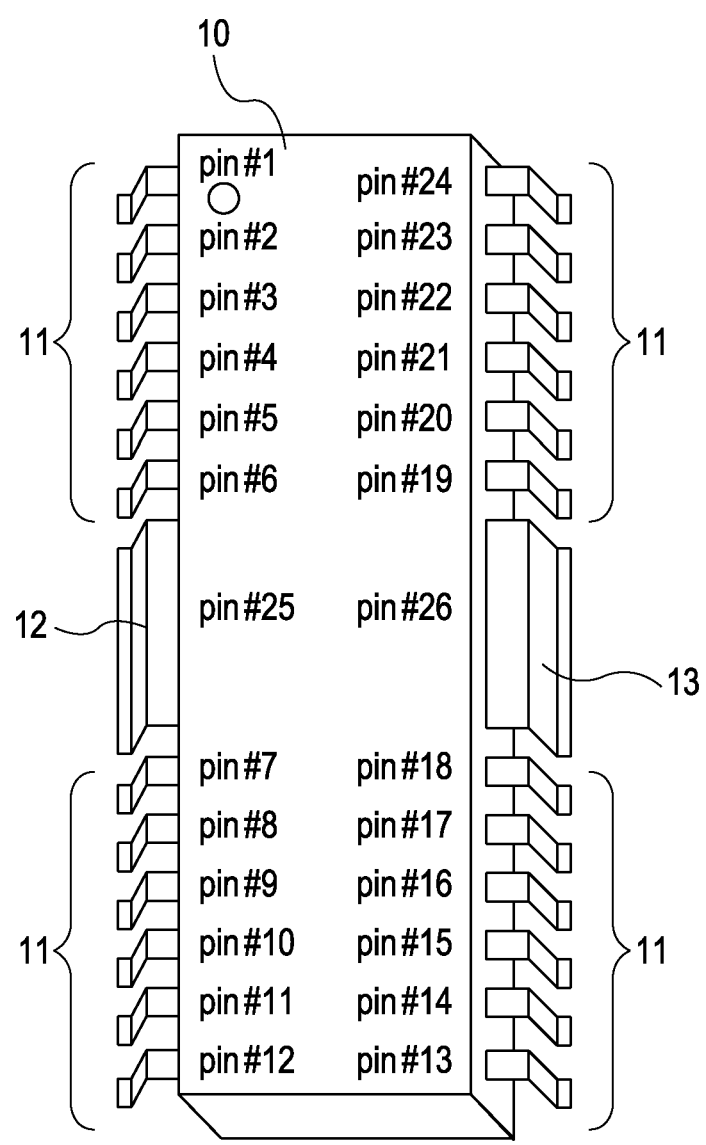
FIG. 1 is a diagram illustrating an IC package according to an embodiment of the present invention.

FIG. 1 illustrates a package for a stepping motor driver IC, which is an example of an IC according to the present embodiment. This package is of the SOP type (dual inline flat package). In FIG. 1, reference numeral 10 denotes this IC. The IC 10 has a total of 26 pins. Pins 11 are normal pins having a width of 0.35 mm and arranged with a pitch of 0.8 mm. Pin 12 and 13 are ground (GND) pins that also serve as heat radiation pins. The pins 12 and 13 are connected to a frame (not shown) on which an IC chip is mounted, and the pins 12 and 13 are configured to effectively radiate heat generated by the IC chip. The pins 12 and 13 have a width greater than the width of pins 11. The pins 12 and 13 have a large width to achieve high heat conductivity to a board pattern.

In FIG. 1, the pins are assigned pin numbers #1 to #26. For example, pin #1 is a pin with a pin number #1. Similarly, pin #2 to pin #26 are pins with pin numbers #2 to #26. Note that pin #25 is denoted by reference numeral 12 (pin 12), and pin #26 is denoted by reference numeral 13 (pin 13). Pins #1 to #6, pins #7 to #12, pins #13 to #18, and pins #19 to #24 are collectively denoted by reference numeral 11 (pins 11). Do not confuse pin numbers with reference numerals.

Figure 2:
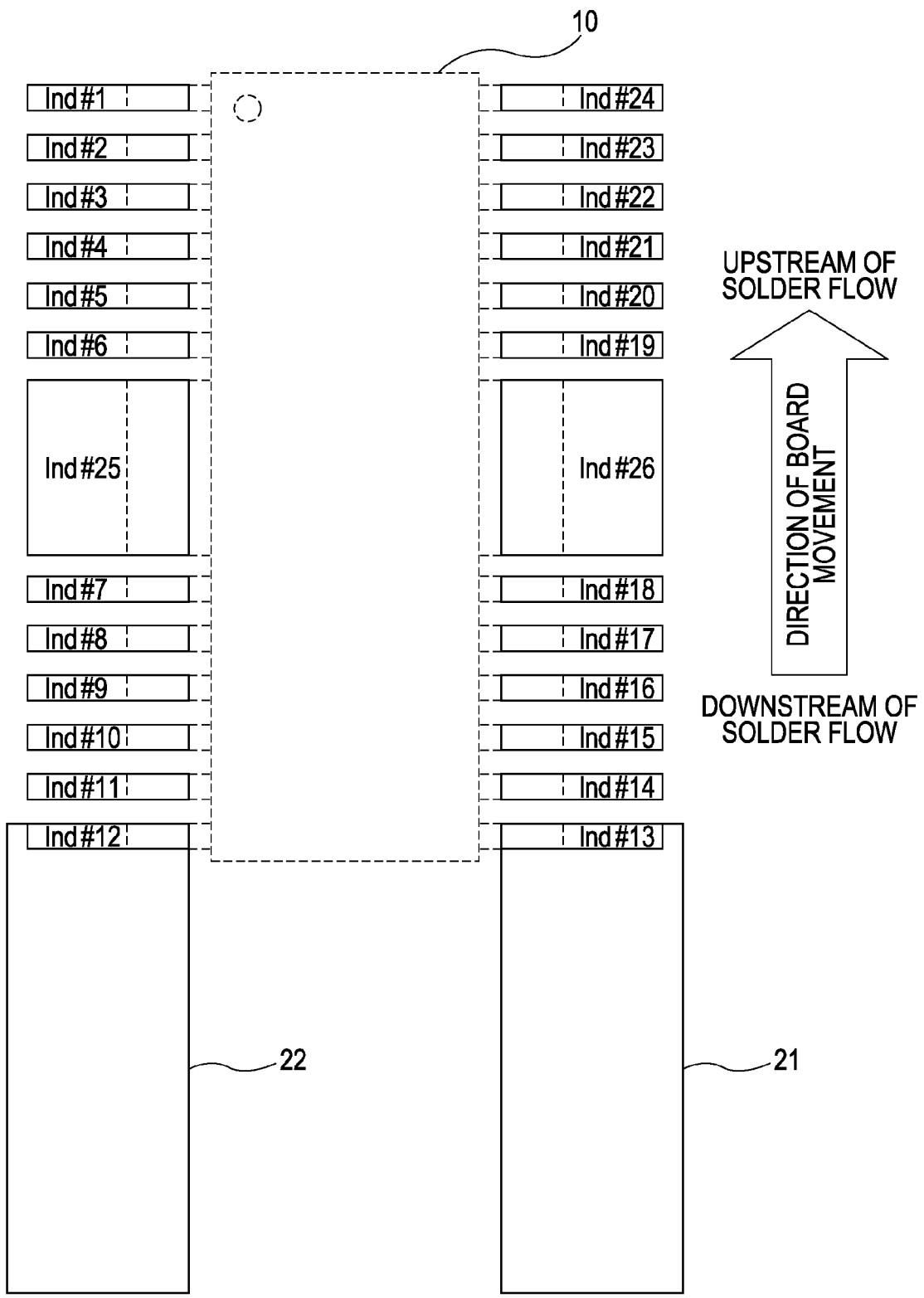
FIG. 2 is a diagram illustrating an IC and a conventional layout of lands for comparison with an embodiment of the invention.
Figure 3:
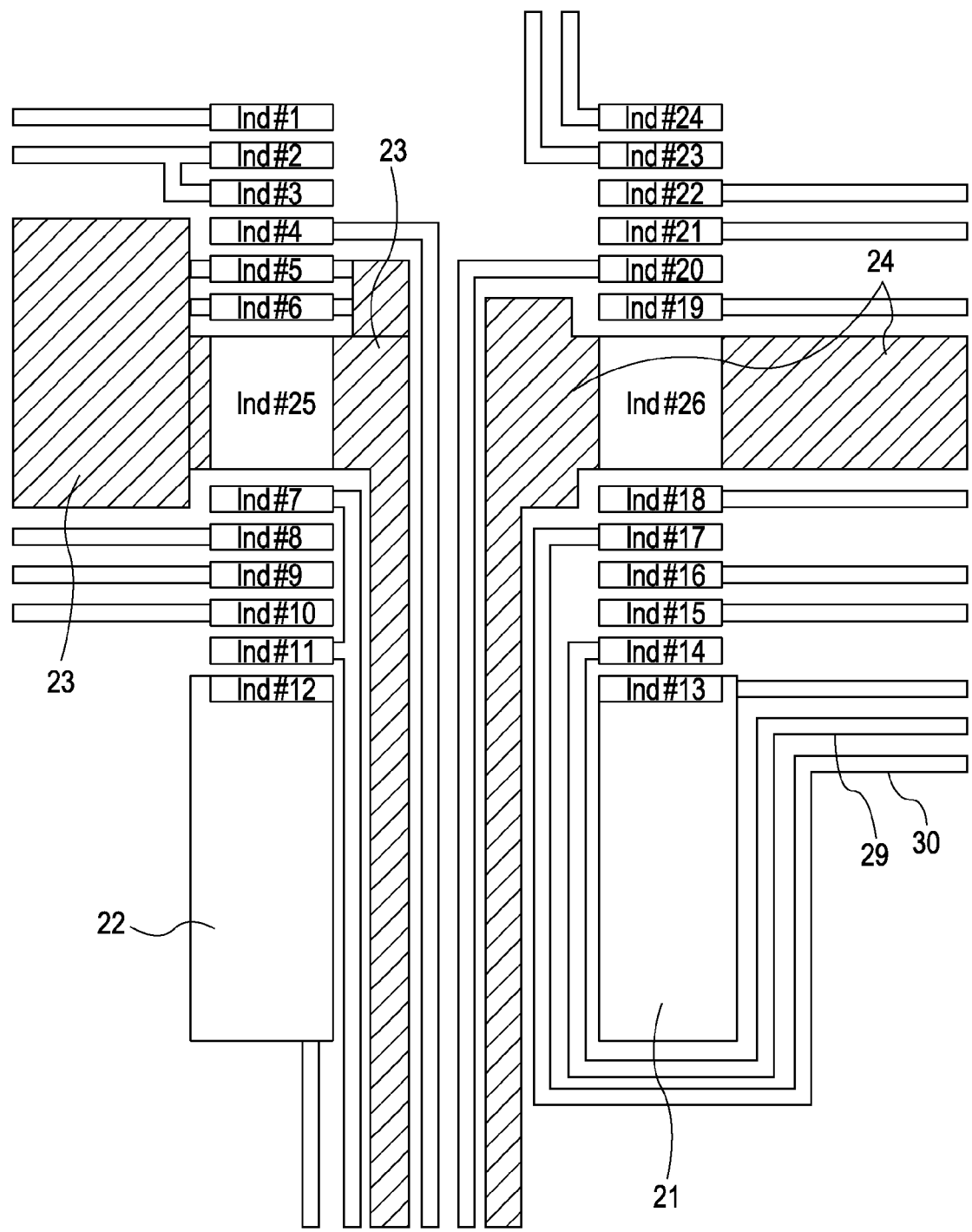
FIG. 3 is a diagram illustrating a conventional wiring pattern for comparison with an embodiment of the invention.

FIGS. 2 and 3 illustrate an example of a conventional wiring pattern of a printed circuit board. For ease of understanding the effects of the present embodiment, a conventional board pattern is first explained.

FIG. 2 illustrates an IC 10 (represented by a dotted line) and lands formed on a printed circuit board. A land with a land number LND #1 is for connection with the pin #1. On this land, a resist formed on a thin copper film has a window (a part having no resist formed by partially removing the resist) having a similar shape to the shape of the land and formed so that the land is exposed via this window. Similarly, lands LND #2 to LND #26 are for connections with pins #2 to #26. The lands LND #1 to LND #26 form a set of solder lands with which to connect the IC 10 by soldering.

A solder bridge prevention land (also referred to as a dummy land) 22 with a rectangular shape is formed so as to include the land LND #12. The resist has a window (an area having no resist) corresponding to the shape of the solder bridge prevention land 22 shown in FIG. 2. Similarly, a solder bridge prevention land 21 is formed so as to include the land LND #13. Note that the solder bridge prevention lands 22 and 21 are formed at locations corresponding to pins at most downstream locations in a solder flow direction of the IC 10. In FIG. 2, the direction of the movement of the printed circuit board is represented by an arrow. That is, the solder flows in a direction opposite to the arrow and thus upstream and downstream sides of the solder flow are as shown in FIG. 2.

FIG. 3 illustrates a state in which the IC 10 shown in FIG. 2 is removed, and wiring patterns on the printed circuit board are added to the figure. A ground pattern 23 (shaded with slant lines in FIG. 3) connected to the land LND #25 is formed so as to have a large width using a thin copper film thereby achieving high heat radiation performance. However, the size of the ground pattern 3 is restricted by a pattern connected to the pin #3 or a signal line pattern connected to the pin #8 (represented by solid areas in FIG. 3) or the like, and thus the size of the ground pattern 3 can be not large enough. Similarly, a ground pattern 24 connected to the pin #26 is limited in size by patterns connected to other pins (such as a pattern connected to the pin #17). To achieve high heat radiation in the conventional technique, the size of the printed circuit board is increased, and the size of the copper film pattern for the heat radiation is expanded. Alternatively, another heat radiation plate is disposed on the printed circuit board. If the size of the copper film pattern for heat radiation is increased while maintaining the total size of the printed circuit board, the result is a reduction in area usable to mount the IC (a reduction in flexibility in mounting the IC).

Figure 4:
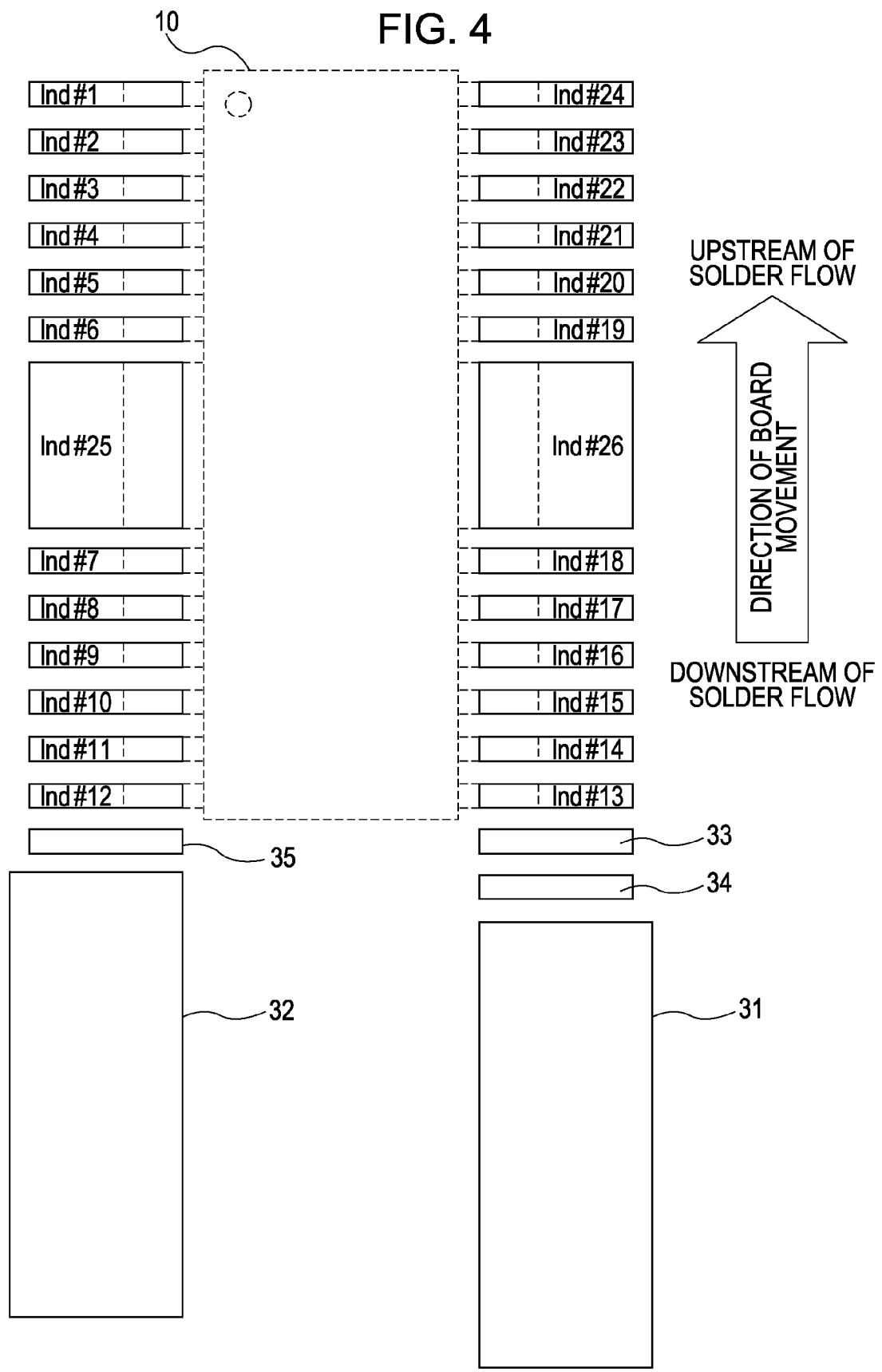
FIG. 4 is a diagram illustrating an IC and a layout of lands according to an embodiment of the present invention.
Figure 5:
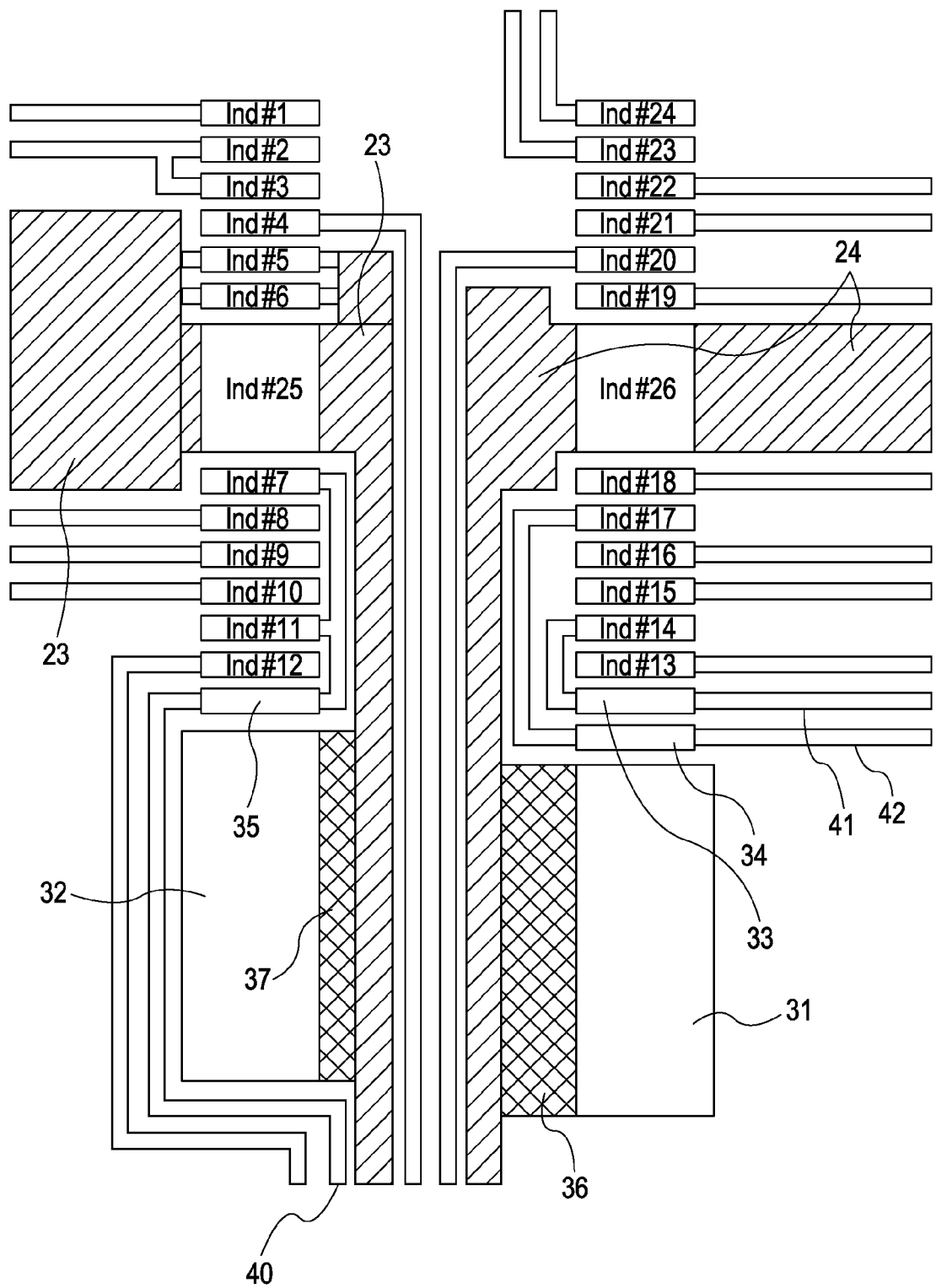
FIG. 5 is a diagram illustrating a wiring pattern according to an embodiment of the present invention.

Next, the pattern on the printed circuit board according to the present embodiment is described below. FIGS. 4 and 5 illustrate an example of a pattern according to the present embodiment of the invention. In FIG. 4, reference numeral 10 denotes an IC (Integrated Circuit) similar to that shown in FIG. 2, i.e., the IC 10 shown in FIG. 4 is similar to the IC shown in FIG. 1. The patterns shown in FIG. 4 are different from those shown in FIG. 2 in that there are additional copper-exposed parts 33, 34, and 35 (where there is no resist). The copper-exposed parts 33 and 34 are the same in size and pitch as the lands LND #13 to LND #24. Similarly, the copper-exposed part 35 is the same in size and pitch (the land-to-land distance) as the lands LND #1 to LND #12. In the present embodiment, unlike the conventional pattern, because of the presence of copper-exposed parts 33, 34, and 35, the rectangular solder bridge prevention lands 31 and 32 do not include the land LND #13 or the land LND #12.

FIG. 5 illustrates a state in which the IC 10 shown in FIG. 4 is removed, and patterns such as signal line patterns on the printed circuit board are added to the figure. The patterns shown in FIG. 5 are different from the patterns shown in FIG. 3 in that solder bridge prevention lands 32 and 31 are connected to the grand patterns 23 and 24, respectively, via the grand patterns 37 and 36 (shaded with cross hatching lines in FIG. 5) or the like such that the solder bridge prevention lands 32 and 31 are connected to the lands LND #25 and LND #26 for connection with heat radiation pints of the IC 10 via the ground patterns 37, 36, 23, and 24. For the above purpose, a signal line pattern 41 connected to the land LND #14 is partially exposed so as to form a copper-exposed part 33. At the location of the copper-exposed part 33, the signal line pattern 41 has the same width as that of the land LND #13.

Similarly, a signal line pattern 42 connected to the land LND #17 has a part where the thin copper film is exposed (copper-exposed part 34). By forming the patterns in the manner described above, copper-exposed parts 33 and 34 with the same size as that of the lands LND #13 to LND #24 are obtained. That is, on the signal line patterns 41 and 42, no-resist areas are formed between the set of solder lands (LND #13 to LND #24) and the solder bridge prevention land 31 thereby forming the copper-exposed parts 33 and 34.

In the case of the patterns shown in FIG. 3, the ground pattern 24 and the solder bridge prevention land 21 are separated from each other by the signal line patterns 29 and 30 connected to the respective lands LND #14 and LND #17. In the patterns shown in FIG. 5, in contrast, the solder bridge prevention land 31 is connected to the land LND #26 for connection with the heat radiation pin of the IC 10 via the ground pattern 36.

Similarly, by forming the copper-exposed part 35 on the signal line pattern 40, it becomes possible to connect the solder bridge prevention land 32 to the land LND #25 connected to a heat radiation pin of the IC 10 via the ground patterns 37 and 23.

By connecting the land LND #26 for connection with the heat radiation pin of the IC 10 to the solder bridge prevention land 31, the heat radiation performance is improved. A first reason for the good heat radiation performance is that the land LND #26 is connected to the solder bridge prevention land 31 via a pattern with a large width such as the ground pattern 36, and thus it is possible to achieve low heat resistance between the land LND #26 and the solder bridge prevention land 31. A second reason is that the large size of the solder bridge prevention land 31 results in a high heat capacity and a large heat radiation area which lead to high heat radiation performance. A third reason is that solder is formed on the solder bridge prevention land 31 during the flow soldering process, and the solder formed thereon leads to an increase in heat capacitance compared with the state in which no solder is formed on the copper of the solder bridge prevention land 31. That is, the pin #26 serving as the heat radiation pin of the IC 10 is connected, via a pattern with a low heat resistance, to the solder bridge prevention land 31 having high heat capacity and high heat radiation performance, and thus high heat radiation performance is achieved as a whole. The connection between the heat radiation pin #25 and the solder bridge prevention land 38 is made in a similar manner thereby achieving high heat radiation performance.

The increase in heat radiation from the heat radiation pin of the IC 10 achieved by the pattern according to the present embodiment has been described above. Next, a mechanism of preventing formation of solder bridges is described below.

In the present embodiment, the copper-exposed parts 33 and 34 are similar in size to the lands LND #13 to LND #24. If the printed circuit board according to the present embodiment is put in a flow of solder, solder is drawn into the solder bridge prevention land 31. This leads to a reduction in surface tension (interfacial tension) of solder adhering to the lands LND #13 to LND #24, the land LND #26, the copper-exposed parts 33 and 34, and the pins of the IC 10, which prevents formation of solder bridges at each land and each copper-exposed part.

If the signal line pattern 41 or 42 extends between the land LND #13 of the IC 10 and the solder bridge prevention land 31 without forming a copper-exposed part, the result is an increase in the distance between the land (LND #13) of the IC 10 and the solder bridge prevention land 31. This causes the solder bridge prevention land 31 to have a less effect on reducing the surface tension (interfacial tension) of the solder adhering to lands of the IC 10. That is, it can become impossible to well prevent formation of solder bridges. In the conventional technique, to avoid the above situation, priority is given to an increase in productivity (i.e., prevention of formation of solder bridges) although the increase in productivity can lead to a reduction in flexibility in designing signal line patterns. In contrast, the present embodiment makes it possible to prevent formation of solder bridges and makes it possible to increase the heat radiation performance without leading to a reduction in flexibility in designing signal line patterns.

In the present embodiment, the size and pitch (interval) of the copper-exposed parts 33 and 34 are set to be similar to those of the lands of the IC. However, the size and pitch (interval) of the copper-exposed parts 33 and 34 may be set to be slightly different from those of the lands of the IC, unless the difference leads to a reduction in the performance in terms of solder bridge prevention.

As described above, the present embodiment makes is possible to avoid formation of solder bridges, and, in addition, allows signal line patterns to be formed so as to extend between a set of solder lands of an IC and a solder bridge prevention land and also allows an improvement in heat radiation performance of the IC.

In a second embodiment, disclosed is a pattern for connection between a ground pin of a CPU and a solder bridge prevention land.

Figure 6:
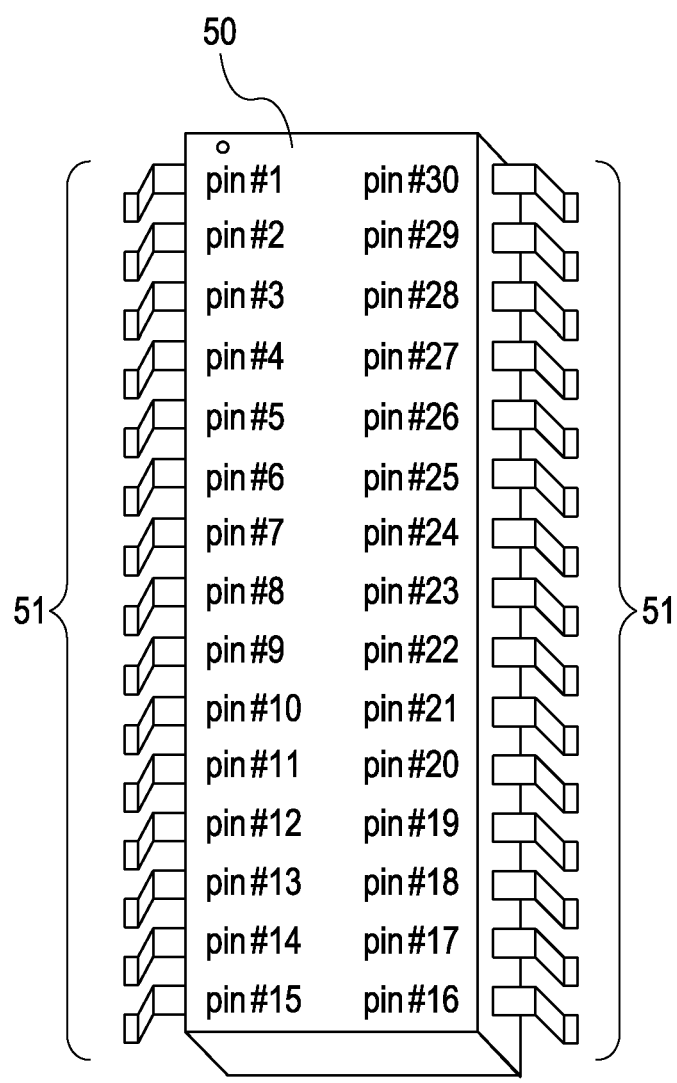
FIG. 6 is a diagram illustrating an IC package according to an embodiment of the present invention.

FIG. 6 illustrates a package of an IC (CPU) according to an embodiment of the present invention. This package is of an SOP (Small Outline Package) type. In FIG. 6, reference numeral 50 denotes the package. The package has a total of 30 pins denoted by reference numeral 51 in FIG. 6. The pins 51 have a width of 0.24 mm and are arranged with a pitch of 0.65 mm. As shown in FIG. 6, the pins are assigned pin numbers #1 to #26. For example, pin #1 is a pin with a pin number #1. Similarly, pin #2 to pin #30 are pins with pin numbers #2 to #30.

Figure 7:
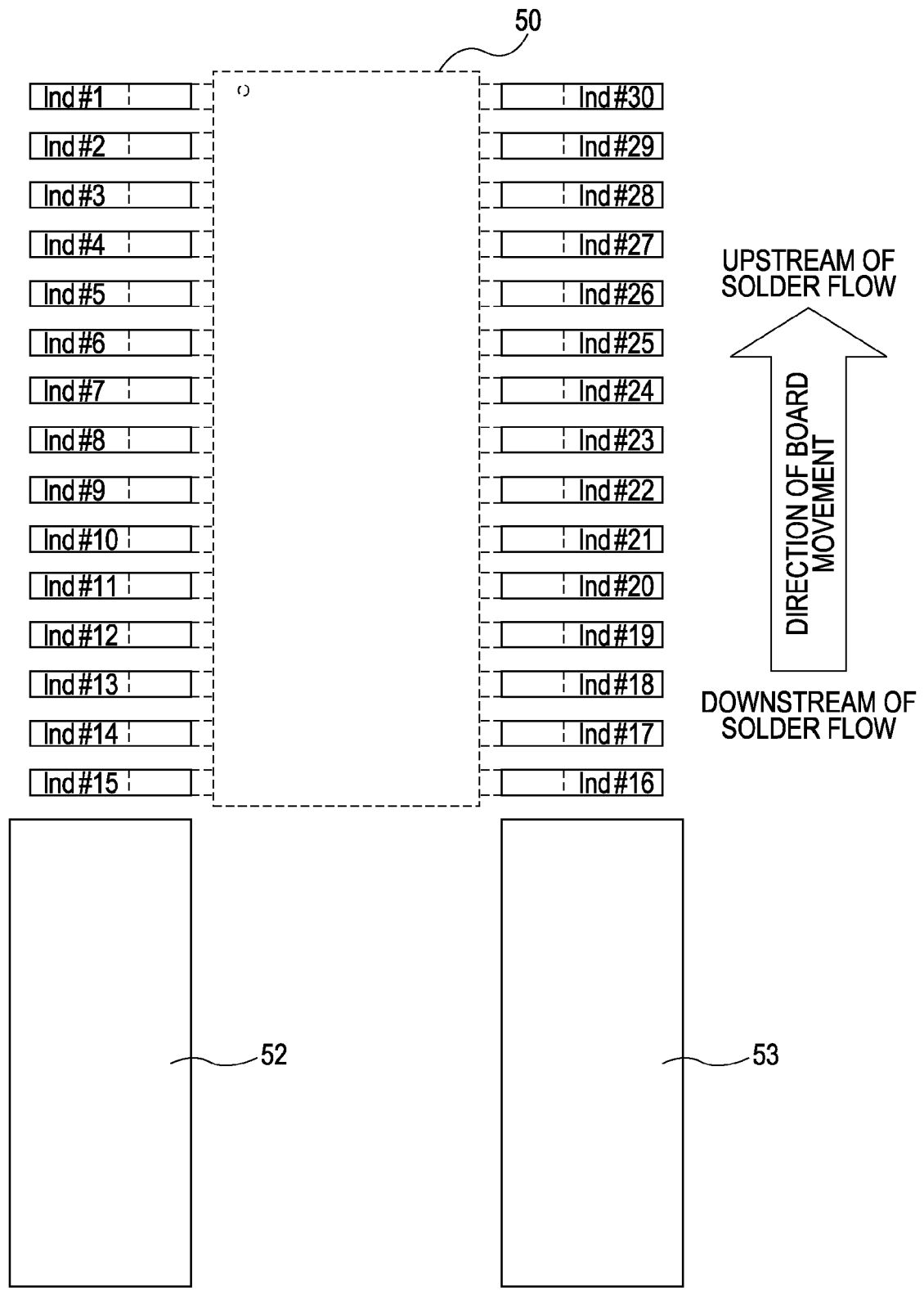
FIG. 7 is a diagram illustrating an IC and a conventional layout of lands for comparison with an embodiment of the invention.
Figure 8:
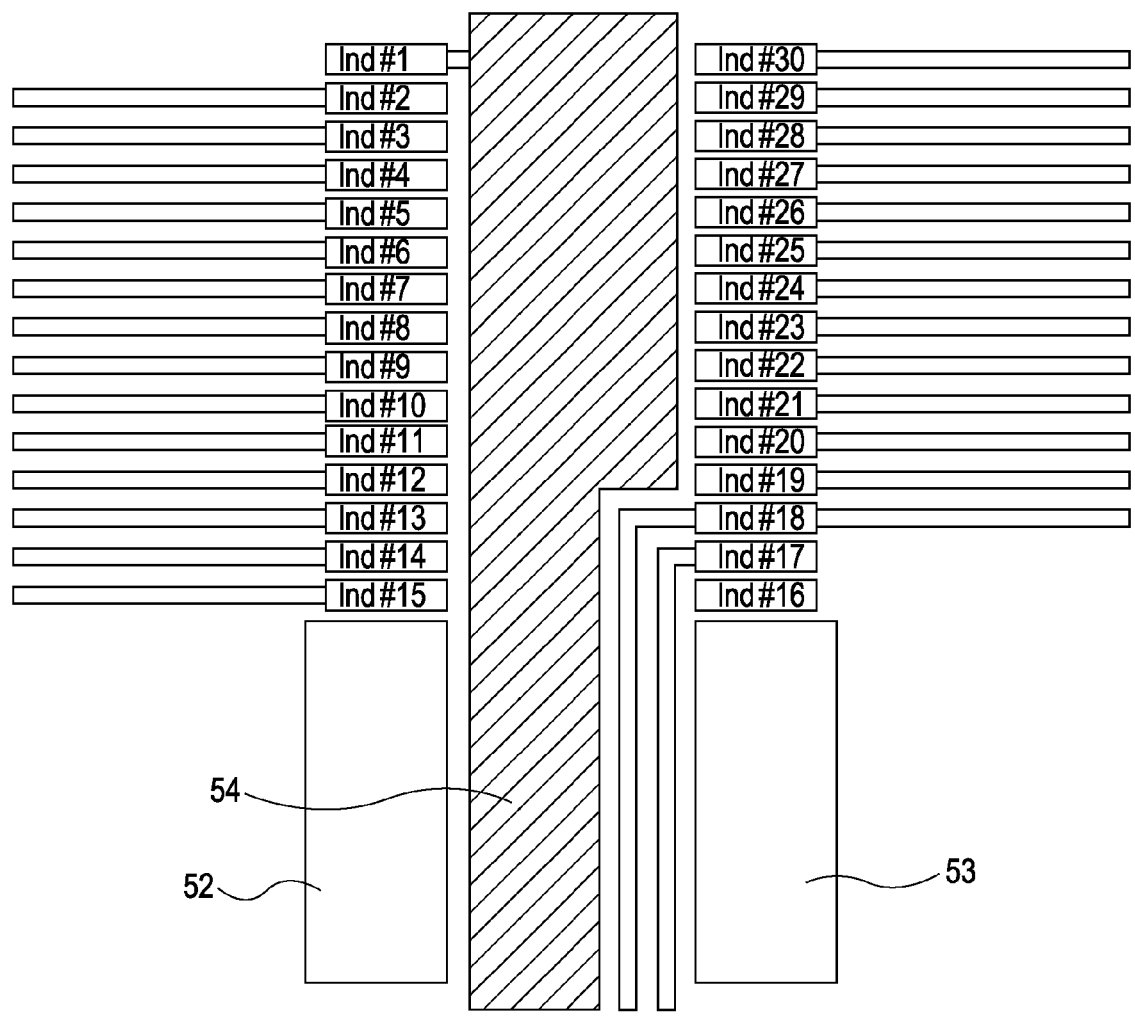
FIG. 8 is a diagram illustrating a conventional wiring pattern for comparison with an embodiment of the invention.

FIGS. 7 and 8 illustrate an example of a conventional pattern of a printed circuit board. For ease of understanding the effects of the present embodiment, a conventional pattern is first explained.

FIG. 7 illustrates relative positions of the IC 50 and lands. A land with a land number LND #1 (represented by a solid line in FIG. 7) is for connection with the pin #1. On this land, a resist formed on a thin copper film has a window (a part having no resist formed by partially removing the resist) having a similar shape to the shape of the land and formed so that the land is exposed via this window. Similarly, lands LND #2 to LND #30 are for connections with pins #2 to #30. Note that an IC corresponding to the IC 50 shown in FIG. 6 is represented by a dotted line in FIG. 7.

A solder bridge prevention land 52 is formed on a downstream side of a land LND #15 as viewed in a solder flow direction. The resist has a window (an area having no resist) with a shape similar to the shape of the solder bridge prevention land 52 shown in FIG. 7. Similarly, a solder bridge prevention land 53 is formed on a downstream side of a land LND #16 as viewed in the solder flow direction. In FIG. 7, the direction of the movement of the printed circuit board is represented by an arrow. That is, the solder flows in a direction opposite to the arrow and thus upstream and the downstream sides of the solder flow are as shown in FIG. 2.

FIG. 8 illustrates a state in which the IC 50 shown in FIG. 7 is removed, and patterns on the printed circuit board are added to the figure. A pin 1 of the IC 50 functions as a ground (GND) pin, which is connected to a large solid ground pattern 54 (shaded by a slant lines in FIG. 8). In general, the greater the number of connections the ground pattern has, the greater the number of return paths of high-frequency signals, and thus the lower the spurious radiation noise. However, in particular, in single-sided boards, the limitation on the layer structure makes it difficult to achieve a ground pattern having a great number of connections.

Next, the pattern on the printed circuit board according to the present embodiment is described below.

Figure 9:
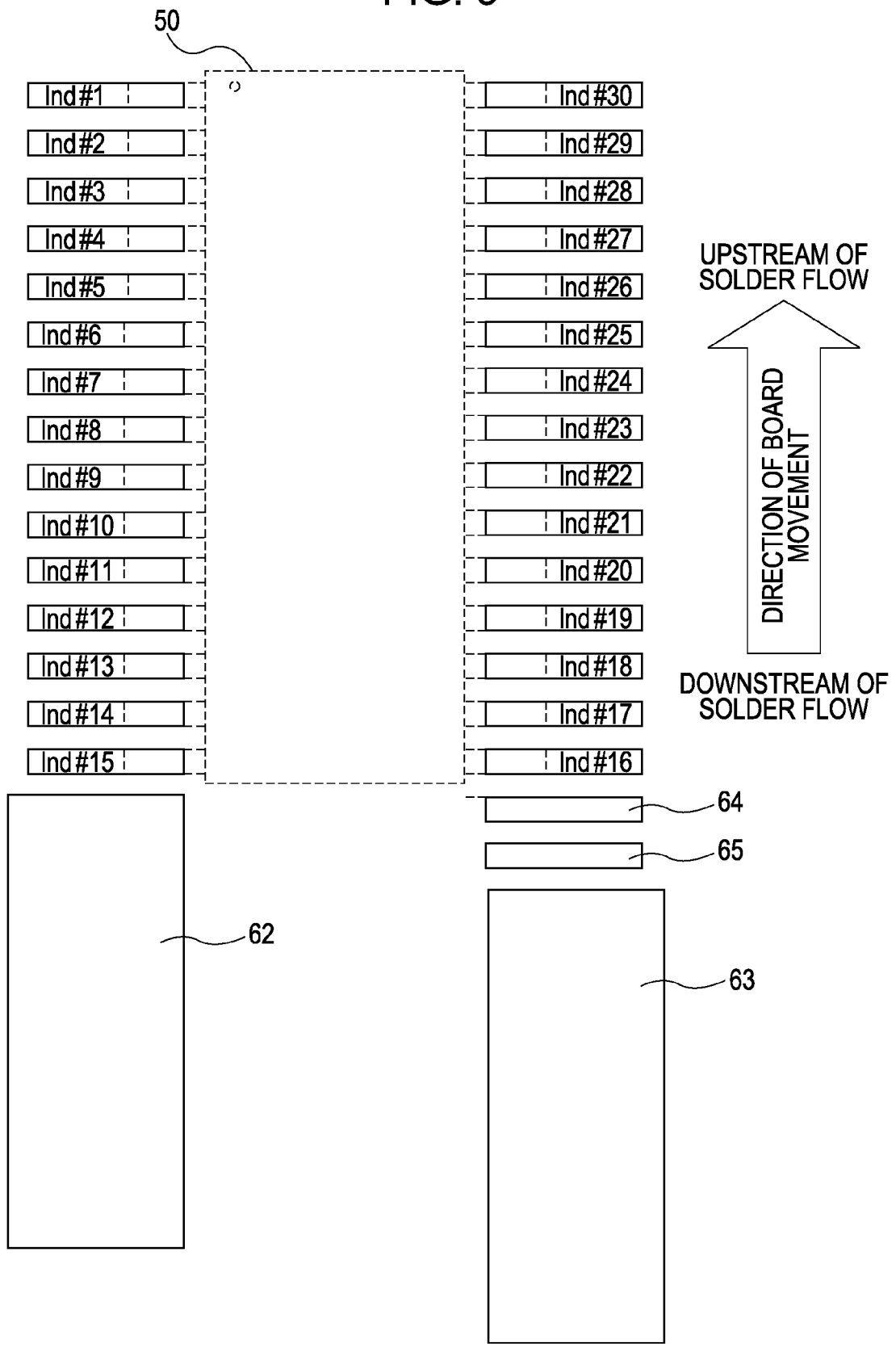
FIG. 9 is a diagram illustrating an IC and a layout of lands according to an embodiment of the present invention.
Figure 10:
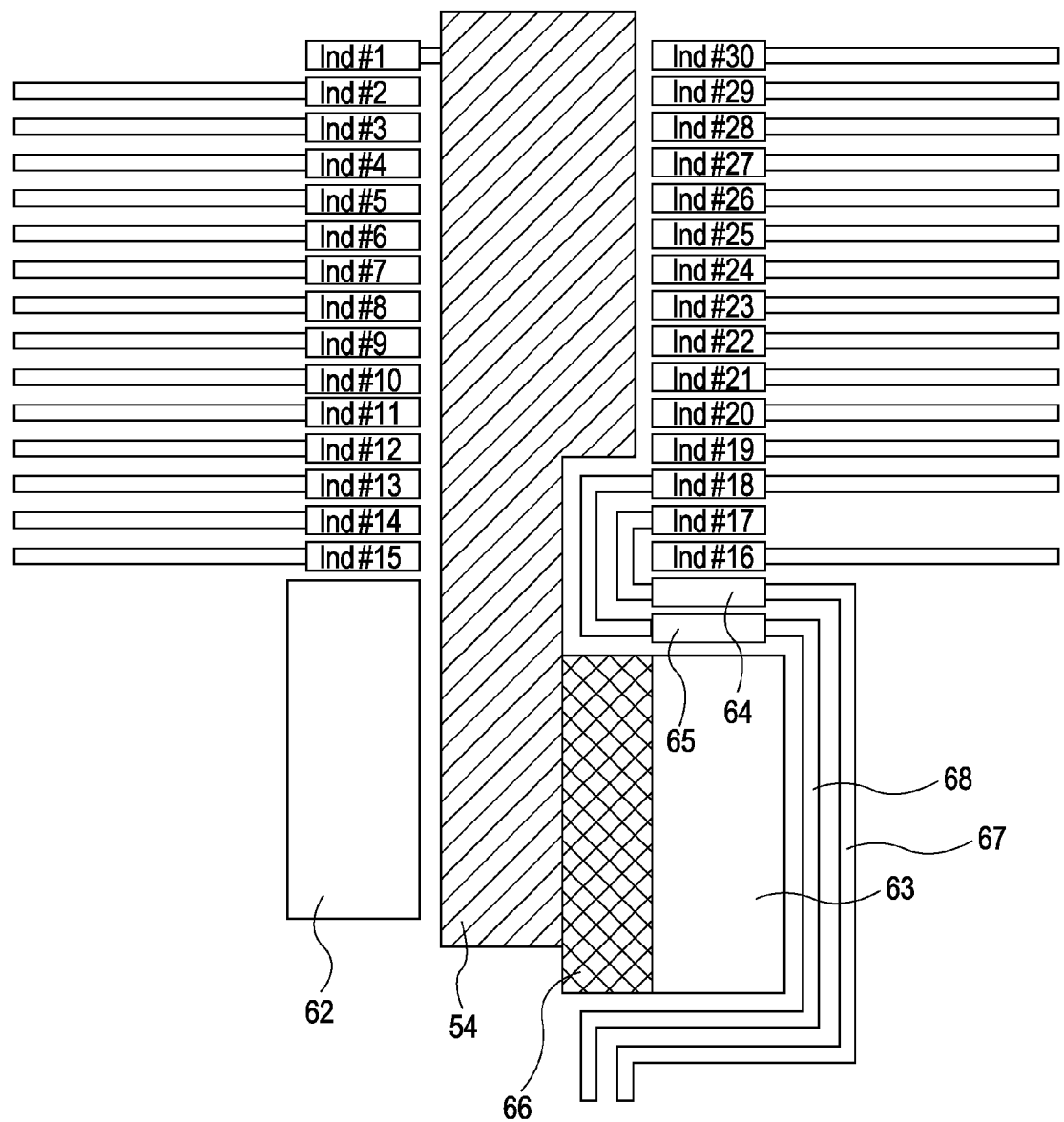
FIG. 10 is a diagram illustrating a wiring pattern according to an embodiment of the present invention.

FIGS. 9 and 10 illustrate an example of a pattern according to the present embodiment of the invention. In FIG. 9, reference numeral 50 denotes an IC (Integrated Circuit) similar to that shown in FIG. 7, i.e., the IC 50 shown in FIG. 9 is similar to the IC shown in FIG. 6. The patterns shown in FIG. 9 are different from those shown in FIG. 7 in that there are additional copper-exposed parts (areas having no resist) 64 and 65. The copper-exposed parts 64 and 65 are the same in size and pitch as the lands LND #16 to LND #30. Reference numerals 62 and 63 denote solder bridge prevention lands according to the present embodiment. Because of the provision of the additional copper-exposed parts 64 and 65, the solder bridge prevention land 63 is formed at a location shifted from the location of the solder bridge prevention land 53 in the conventional example (see FIG. 8).

FIG. 10 illustrates a state in which the IC 50 shown in FIG. 9 is removed, and patterns such as signal line patterns on the printed circuit board are added to the figure. The patterns shown in FIG. 10 are different from the patterns shown in FIG. 8 in that a solder bridge prevention land 63 is connected to a ground pattern 66 (represented by cross hatching lines in FIG. 10) which is connected to a wide and solid ground pattern 54 which is in turn connected to the land LND #1 for connection with the ground pin of the IC 50. To adapt to this configuration, patterns connected to the lands LND #17 and LND #18 have a no-resist area where the thin-copper-film pattern is exposed. More specifically, copper-exposed parts 64 and 65 are formed. At locations of the copper-exposed parts 64 and 65, signal line patterns 67 and 68 have the same width as the width of the lands LND #17 and LND #18.

In the example shown in FIG. 10, the resist over the signal line patterns is partially removed so as to form the copper-exposed parts 64 and 65 where the thin copper film is exposed thereby forming the lands that are similar in size to the lands in direct connection with pins of the IC 50 and that are located in a line following the line of the lands in direct connection with the pins of the IC 50, and thus a high-performance ground connection is achieved while maintaining the functionality of preventing formation of solder bridges.

The functionality of the copper-exposed parts 64 and 65 in terms of preventing formation of solder bridges is obtained based on the same principle as the first embodiment described above, and thus a duplicated explanation thereof is omitted.

As described above, the present embodiment makes is possible to avoid formation of solder bridges, and, in addition, allows signal line patterns to be formed so as to extend between a set of solder lands for soldering an IC and a solder bridge prevention land. Furthermore, it is possible to form a solder bridge prevention land in the shape of a wide and solid ground pattern thereby achieving a reduction in spurious radiation noise.

In a third embodiment of the invention, disclosed is a pattern layout that allows a reduction in the number of solder bridge prevention land for a case in which two ICs are mounted.

Figure 11:
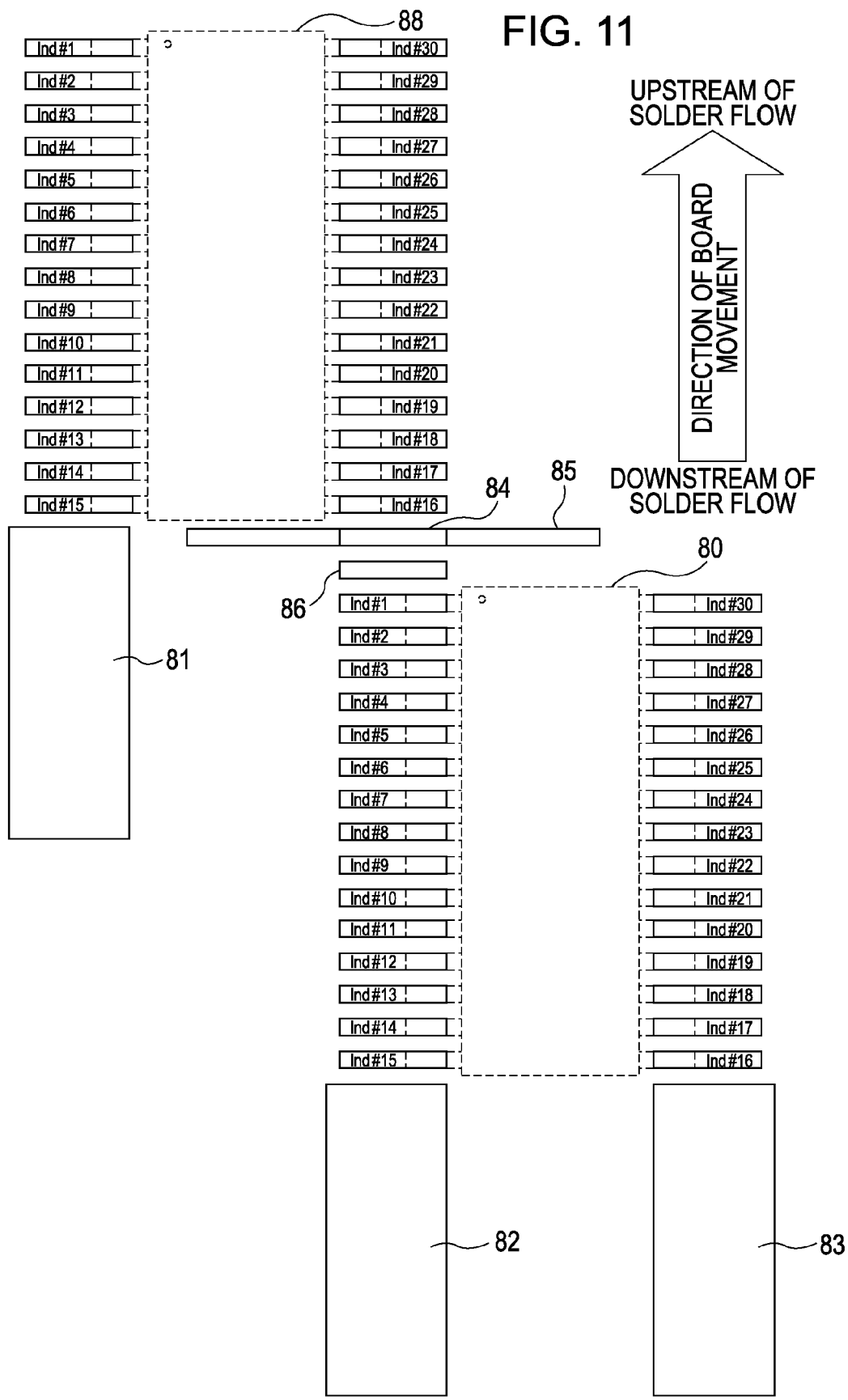
FIG. 11 is a diagram illustrating an IC and a layout of lands according to an embodiment of the present invention.

FIG. 11 illustrates a board pattern according to the present embodiment of the invention. In FIG. 11, reference numerals 88 and 80 denote ICs which are similar to the IC (with 30 pins) according to the second embodiment (see FIG. 6). The ICs 80 and 88 may be ICs similar to the 26-pin IC (such as a stepping motor driver IC) used in the first embodiment (see FIG. 1). Pins of these ICs and lands for connection with the ICs are similar to those according to the first or second embodiment, and thus a duplicated explanation thereof is omitted.

In FIG. 11, reference numeral 81 denotes a solder bridge prevention land for the IC 88. More specifically, the solder bridge prevention land 81 is for preventing formation of solder bridges between lands LND #1 to LND #15 of the IC 88. There is no special solder bridge prevention land for preventing formation of solder bridges between lands LND #16 to LND #30 (a first set of solder lands). That is, there is no solder bridge prevention land similar to the solder bridge prevention land 31 (see FIG. 4) or the solder bridge prevention land 63 (see FIG. 9).

Another IC 80 is mounted at a location on a downstream side of the IC 88 as viewed in a solder flow direction. Lands LND #16 to LND #30 of the IC 88 and lands LND #1 to LND #15 (a second set of solder lands) of the IC 80 are arranged in a single line in the same direction as the solder flow direction. Note that the lands LND #16 to LND #30 of the IC 88 and the lands LND #1 to LND #15 of the IC 80 extend in a direction perpendicular to the solder flow direction. A copper-exposed part 84 and a land 86 (also referred to as a dummy land) are formed between the land LND #16 of the IC 88 and the land LND #1 of the IC 80. The copper-exposed part 84 is formed by partially removing the resist on the signal line pattern 85 in a similar manner to the copper-exposed parts 33 and 34 (see FIG. 5) according to the first embodiment or the copper-exposed parts 64 and 65 (see FIG. 10) according to the second embodiment. The land 86 includes only a thin-copper-film pattern, i.e., the land 86 is not a land formed by partially exposing a signal line pattern. Note that there is no resist at a location corresponding to the land 86 as with the copper-exposed part 84. Solder bridge prevention lands 82 and 83 are formed at a downstream side of the IC 80 as viewed in the solder flow direction. These solder bridge prevention lands are similar to those according to the first or second embodiment.

In the example shown in FIG. 11, as described above, a copper-exposed part and a dummy land are formed between lands of two ICs such that the copper-exposed part and the dummy land have the same size and same pitch as the size and the pitch of the lands of the two ICs.

Next, a mechanism of preventing formation of solder bridges is described below.

The lands LND #1 to LND #15 of the IC 88 and the lands LND #16 to LND #30 of the IC 80 provide the functionality of preventing formation of solder bridges based on the same principle as that according to the first embodiment, and thus a duplicated explanation thereof is omitted.

An explanation is given below as to the mechanism of how formation of solder bridges is prevented by the lands LND #16 to LND #30 of the IC 88, the copper-exposed part 84, the land 86, and the lands LND #1 to LND #15 of the IC 80 (hereafter collectively referred to as a set of lands). If a printed circuit board according to the present embodiment of the invention is put in a flow of solder, solder is drawn into the solder bridge prevention land 82. This leads to a reduction in surface tension (interfacial tension) of solder adhering to the set of lands and the pins of the IC 80 and IC 88, which prevents formation of solder bridges at each land (of the set of lands) and the copper-exposed parts. Therefore, it is not necessary to form a special solder bridge prevention land for exclusive use for the IC 88 on the downstream side, as viewed in the solder flow direction, of the line of lands LND #16 to LND #30 of the IC 88.

In the pattern layout shown in FIG. 11, because of unnecessity of forming a special solder bridge prevention land for exclusive use for the lands LND #16 to LND #30 of the IC 88, it becomes possible to reduce the total board size and increase the flexibility in designing signal line patterns.

In the printed circuit board on which two ICs are mounted by single-sided flow soldering, as described above, the pattern layout according to the present embodiment of the invention allows a reduction in the number of solder bridge prevention lands, a reduction in the total board size, and an increase in flexibility in designing signal line patterns.

In a fourth embodiment of the present invention described below, disclosed is a technique of forming a solder bridge prevention land on a dummy board that is to be separated from a main board portion for actual use.

Figure 12:
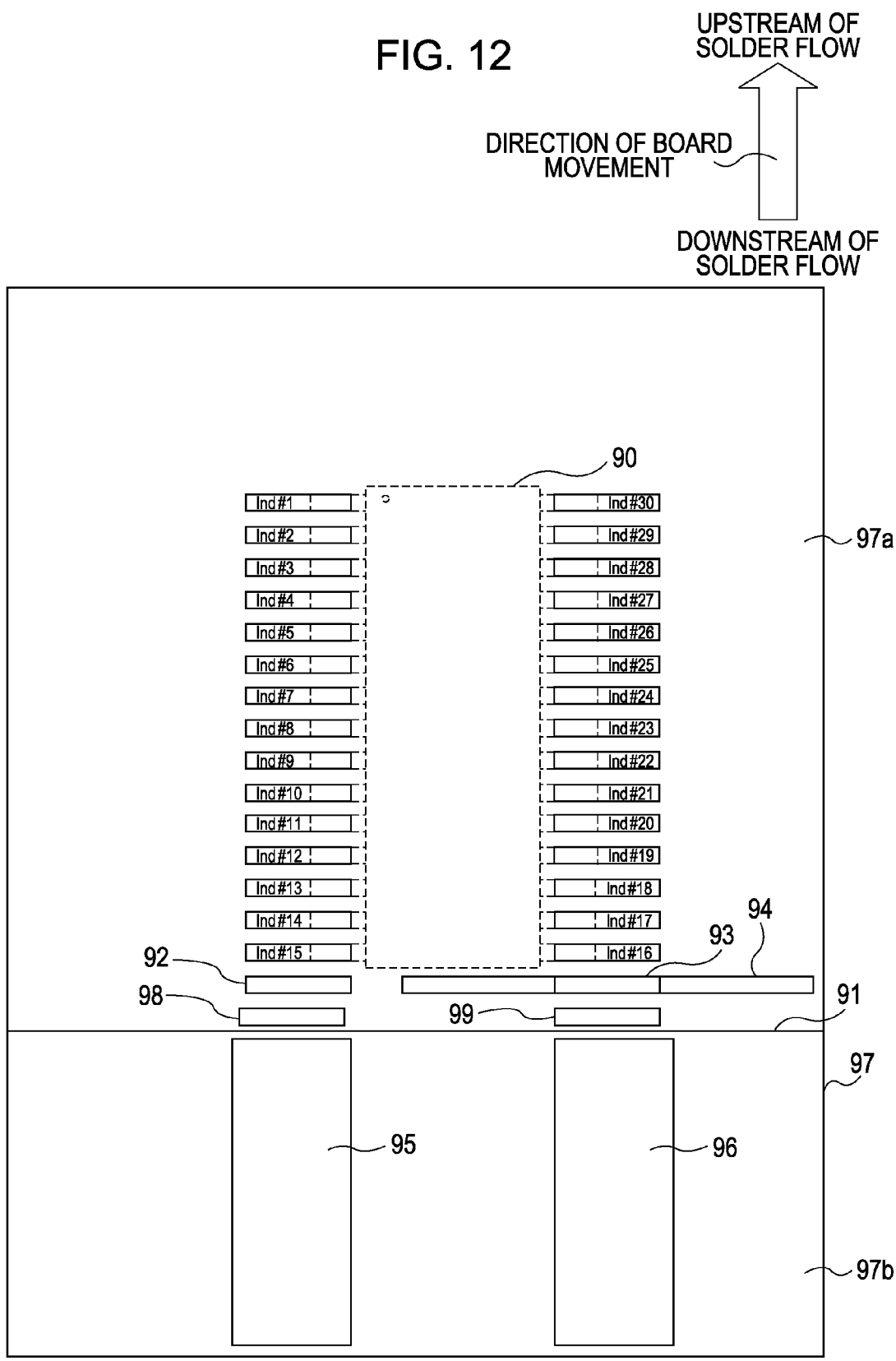
FIG. 12 is a diagram illustrating an IC and a layout of lands according to an embodiment of the present invention.

FIG. 12 illustrates a board pattern according to the present embodiment of the invention. In FIG. 12, reference numeral 90 denotes an IC similar to that used in the second embodiment (see FIG. 6), and reference numeral 97 denotes a printed circuit board (also referred to simply as a board) on which the IC 90 is mounted. Reference numeral 91 denotes a V-shaped groove formed in the board. The V-shaped groove 91 serving as a dividing part for dividing the board into two parts 97a and 97b. The part 97a located on an upper side, as viewed in FIG. 12, of the V-shaped groove 91 is a board for actual use, and the part 97b located on a lower side of the V-shaped groove 91 is a dummy board that is not actually used. Reference numeral 93 denotes a copper-exposed part, and reference numerals 92, 98, and 99 denote lands (dummy lands) which are similar to the dummy land according to the third embodiment described above. The copper-exposed part 93 is produced by forming a no-resist part on the signal line pattern 94 such that the no-resist part has a similar shape to the lands (LND #16 to LND #30) in a similar manner to the second embodiment described above. Reference numerals 95 and 96 denote solder bridge prevention lands.

In the present embodiment, an end of the board 97a for actual use is located between a set of solder bridge prevention lands 95 and 96 and a set of lands (including the lands LND #1 to LND #30, lands 92, 98, and 99, and the copper-exposed part 93) to be protected from formation of solder bridges. In this configuration, the solder bridge prevention lands 95 and 96 on the dummy board 97b provide the functionality of reducing the surface tension (interfacial tension) of solder adhering to each of the set of lands, and thus formation of solder bridges is prevented.

In the present embodiment, the V-shaped groove 91 is formed on the board such that the board is allowed to be divided into two parts by the V-shaped groove 91. Instead of the V-shaped groove 91, a slit may be formed in the board for the same purpose such that the solder bridge prevention lands 95 and 96 are formed at locations close enough to the set of lands to be protected from formation of solder bridges.

Figure 13:
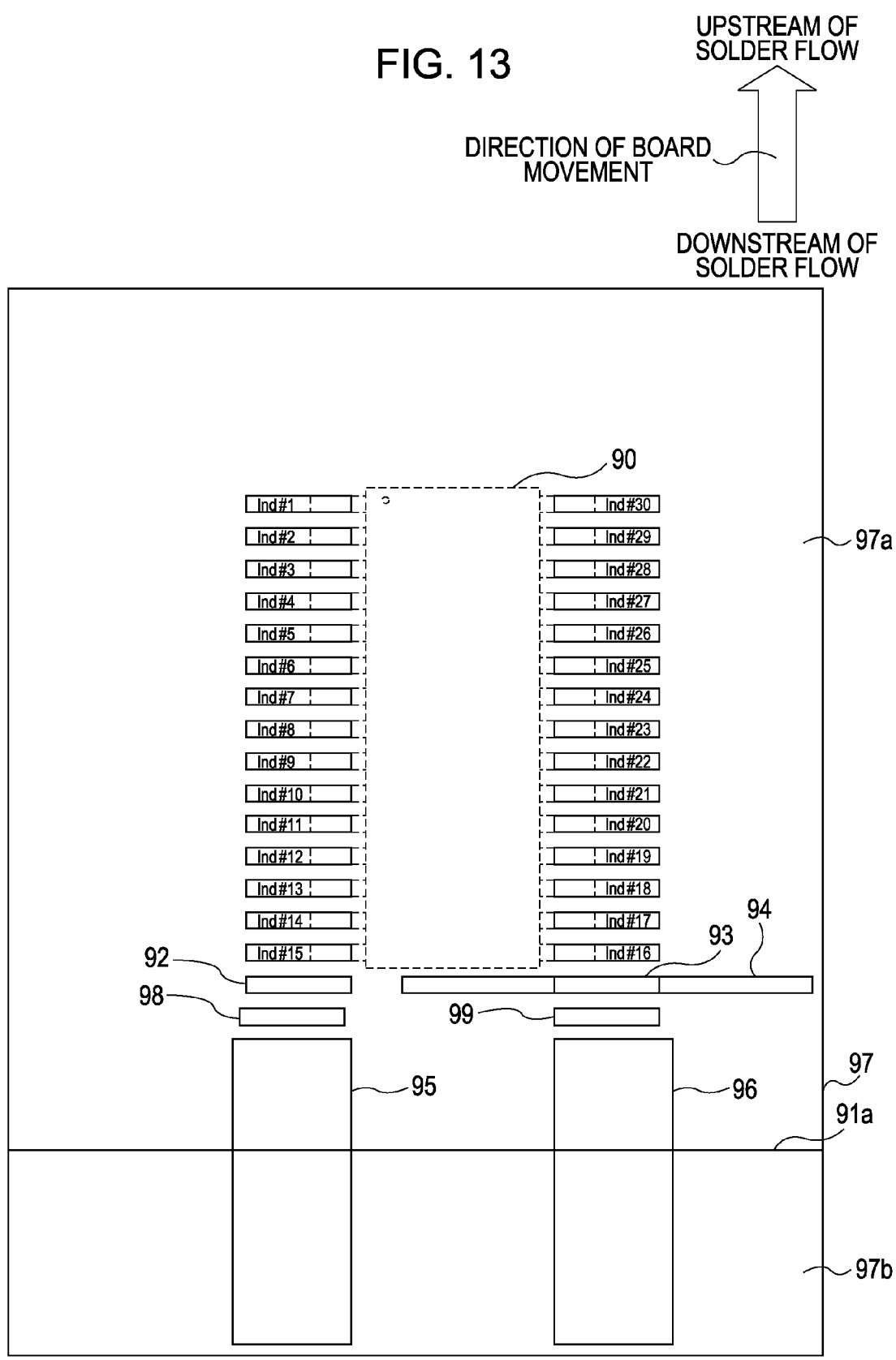
FIG. 13 is a diagram illustrating an IC and a layout of lands according to an embodiment of the present invention.
Figure 14:
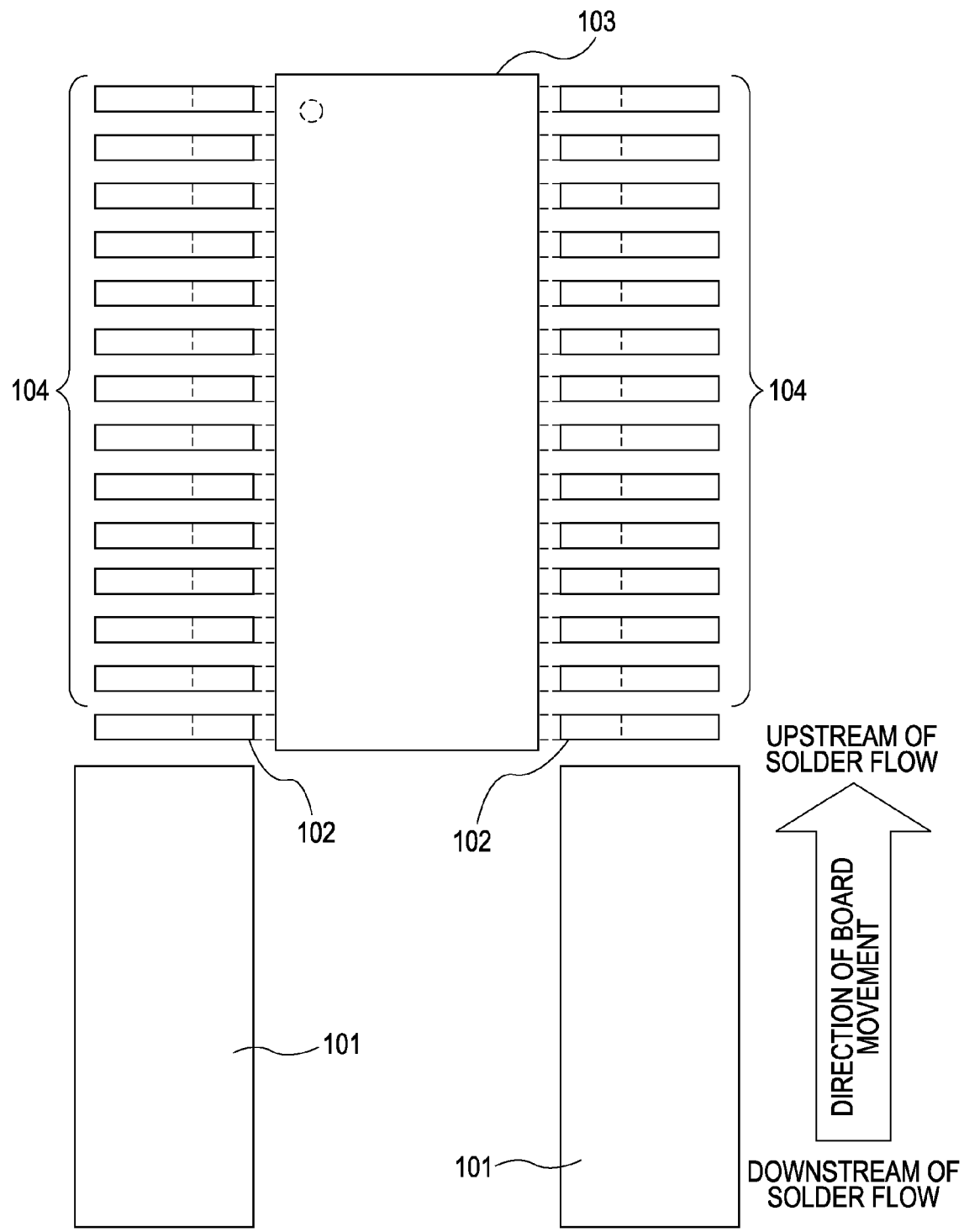
FIG. 14 is a diagram illustrating a conventional solder bridge prevention land.
Figure 15:
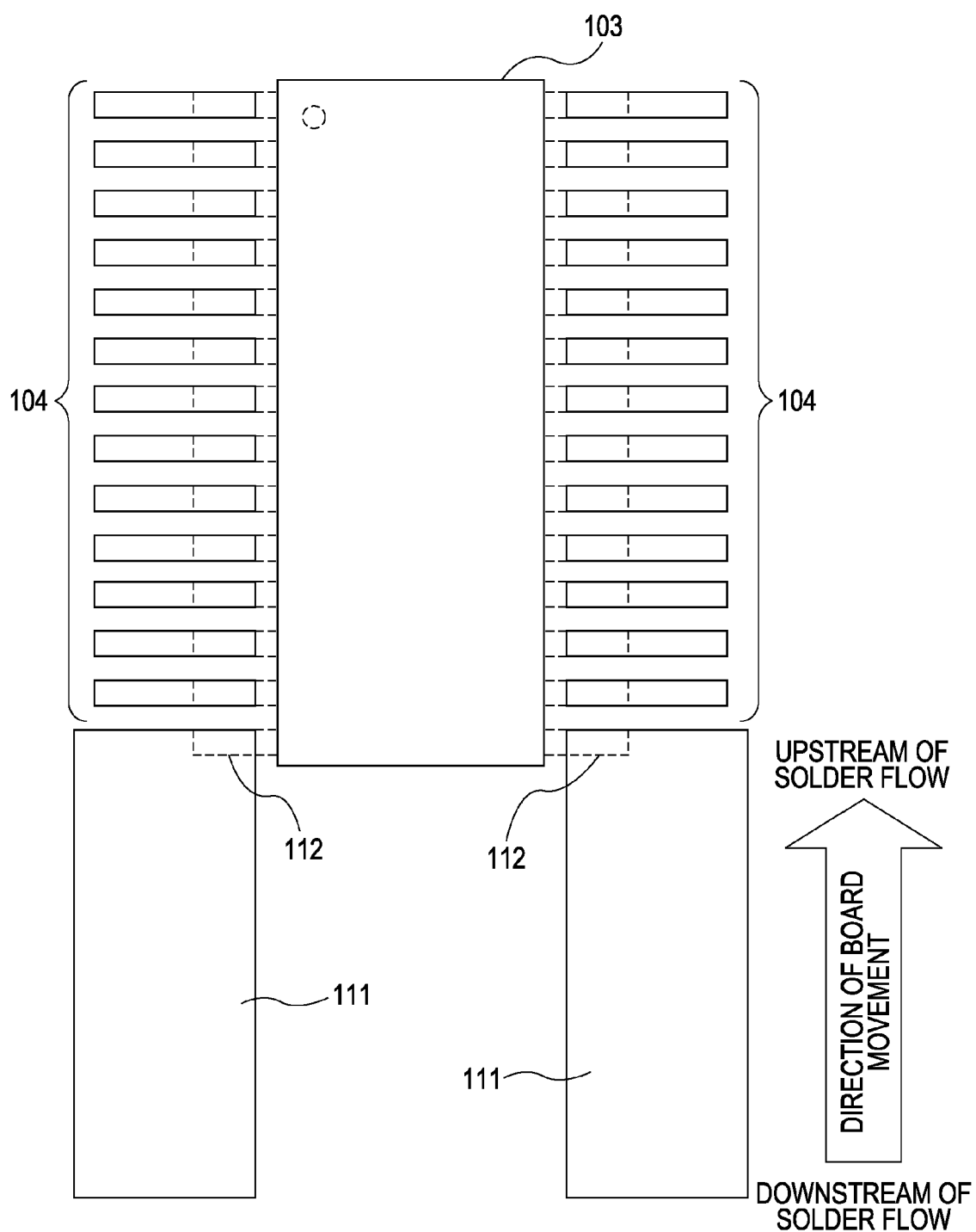
FIG. 15 is a diagram illustrating a conventional solder bridge prevention land.

The position of the V-shaped groove 91 is not limited to that in the above example, but the V-shaped groove 91 may be formed at a different position. FIG. 13 illustrates an example in which the V-shaped groove is formed at a position 91a. In this example, the V-shaped groove 91a is formed in the middle of the solder bridge prevention land 95 and in the middle of the solder bridge prevention land 96. This configuration makes it possible to reduce the distance between the solder bridge prevention land 95 and the land 98 and between the solder bridge prevention land 96 and the land 99 compared with the configuration shown in FIG. 12, and thus formation of solder bridges can be prevented more effectively.

In the embodiment described above, the V-shaped groove is formed to thereby allow the board to be separated. Note that other mechanisms or structures may be employed to separate the board. For example, a series of perforations may be formed to thereby separate the board.

In the present embodiment, as described above, solder bridge prevention lands with a large size are formed on a dummy board. This allows a reduction in the size of the board for actual use, and also allows an increase in flexibility in layout of wiring patterns.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

What is claimed is:

1. A printed circuit board to be transported in a solder bath so that an electric part is to be soldered to the printed circuit board, the printed circuit board comprising:
   a first solder land configured to be soldered with a terminal of the electronic part;
   a second solder land configured to guide solder, a size of the second solder land being larger than a size of the first solder land, and the second solder land being disposed on a downstream side of the first solder land as viewed in a direction in which the printed circuit board is transported; and
   a signal line configured to be arranged between the first solder land and the second solder land, the solder being attached to a part of the signal line that is arranged between the first solder land and the second solder land, and that is to be soldered, and is not soldered with the terminal of the electronic part.

2. The printed circuit board according to claim 1, further comprising:
   a heat radiation pattern,
   wherein the second solder land is connected to the heat radiation pattern.

3. The printed circuit board according to claim 1, further comprising:
   a ground pattern,
   wherein the second solder land is connected to the ground pattern.

4. The printed circuit board according to claim 1, wherein the electric part includes a flat package IC.

5. A printed circuit board transported in a solder bath and being soldered with an electric part, the printed circuit board comprising:
   a first solder land to which a terminal of the electronic part is soldered;
   a second solder land to which solder is attached, the second solder land being disposed on a downstream side of the first solder land as viewed in a direction in which the printed circuit board has been transported; and
   a signal line including a part soldered between the first solder land and the second solder land, and not soldered with the terminal of the electronic part.

6. The printed circuit board according to claim 5, further comprising:
   a heat radiation pattern,
   wherein the second solder land is connected to the heat radiation pattern.

7. The printed circuit board according to claim 5, further comprising:
   a ground pattern,
   wherein the second solder land is connected to the ground pattern.

8. The printed circuit board according to claim 5, wherein the electric part includes a flat package IC.

* * * * *